United States Patent
Li et al.

(10) Patent No.: US 9,559,135 B2
(45) Date of Patent: Jan. 31, 2017

(54) CONDUCTION LAYER FOR STACKED CIS CHARGING PREVENTION

(71) Applicant: TAIWAN SEMICONDUCTOR MANUFACTURING COMPANY LTD., Hsinchu (TW)

(72) Inventors: Cheng-Yuan Li, Kaohsiung (TW); Kun-Huei Lin, Tainan (TW); Chun-Hao Chou, Tainan (TW); Kuo-Cheng Lee, Tainan (TW); Yung-Lung Hsu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/464,035

(22) Filed: Aug. 20, 2014

(65) Prior Publication Data

US 2016/0056196 A1 Feb. 25, 2016

(51) Int. Cl.
*H01L 23/48* (2006.01)
*H01L 27/146* (2006.01)
*H01L 31/18* (2006.01)
*H01L 31/02* (2006.01)

(52) U.S. Cl.
CPC ..... *H01L 27/14636* (2013.01); *H01L 27/1464* (2013.01); *H01L 27/1469* (2013.01); *H01L 27/14623* (2013.01); *H01L 27/14634* (2013.01); *H01L 31/02002* (2013.01); *H01L 27/14621* (2013.01); *H01L 27/14627* (2013.01)

(58) Field of Classification Search
CPC .............. H01L 27/14621; H01L 27/14627; H01L 27/1464
See application file for complete search history.

(56) References Cited

U.S. PATENT DOCUMENTS

| | | | |
|---|---|---|---|
| 2012/0326312 A1* | 12/2012 | JangJian | H01L 21/3105 257/751 |
| 2013/0320475 A1* | 12/2013 | Takahashi | H01L 21/76898 257/432 |
| 2014/0124889 A1* | 5/2014 | Qian | H01L 27/14618 257/448 |

* cited by examiner

*Primary Examiner* — Pamela E Perkins
(74) *Attorney, Agent, or Firm* — WPAT, P.C., Intellectual Property Attorneys; Anthony King

(57) ABSTRACT

A semiconductor device includes a first semiconductor chip comprising a first metallic structure and a second semiconductor chip comprising a second metallic structure. The second semiconductor chip is bonded with the first semiconductor chip by a first conductive plug. A second conductive plug extends from the first metallic structure and into a substrate of the first semiconductor chip. The first conductive plug connects the first metallic structure and the second metallic structure, wherein a conductive liner is along a sidewall of the first conductive plug or the second conductive plug.

20 Claims, 20 Drawing Sheets

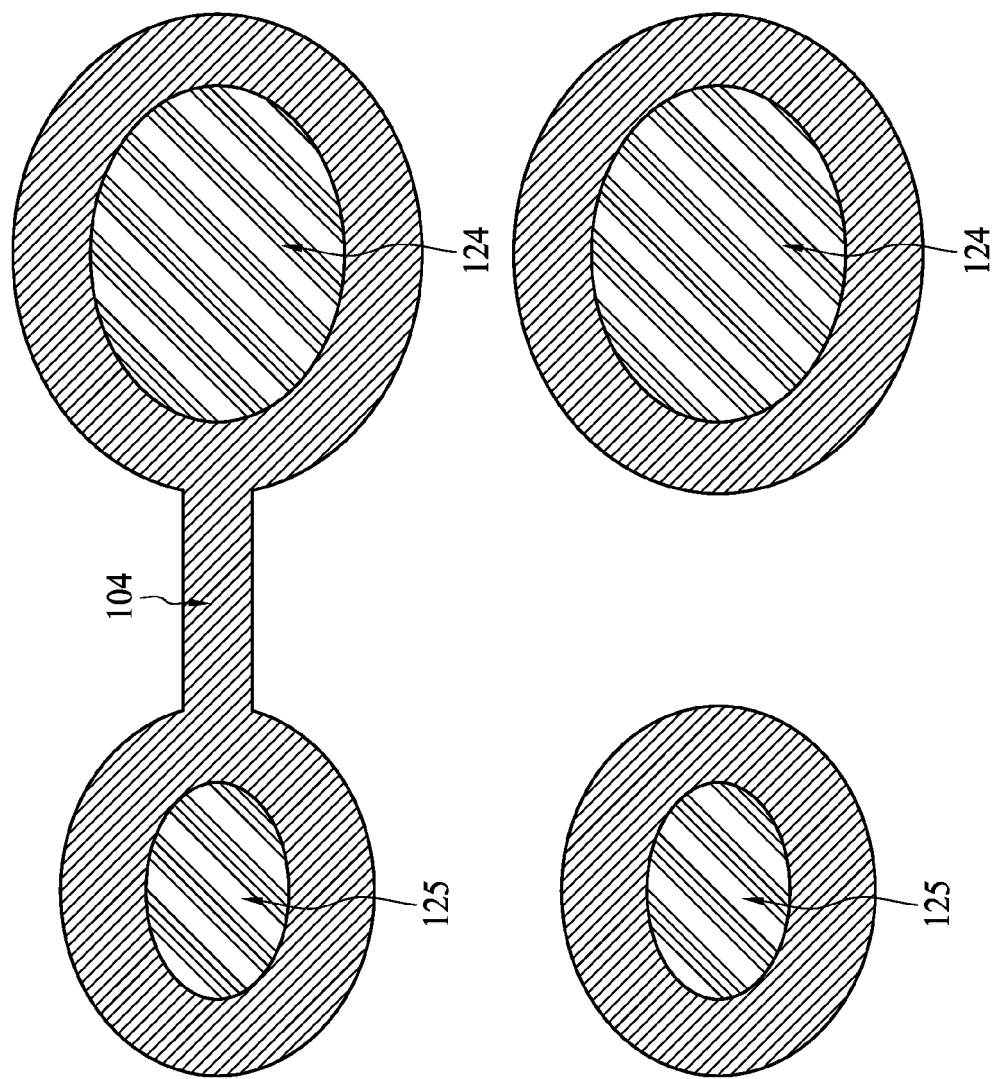

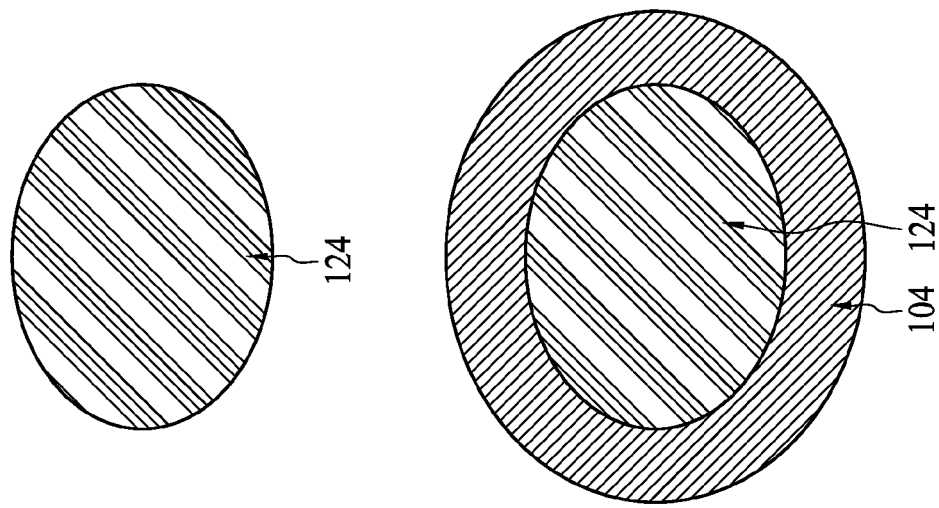
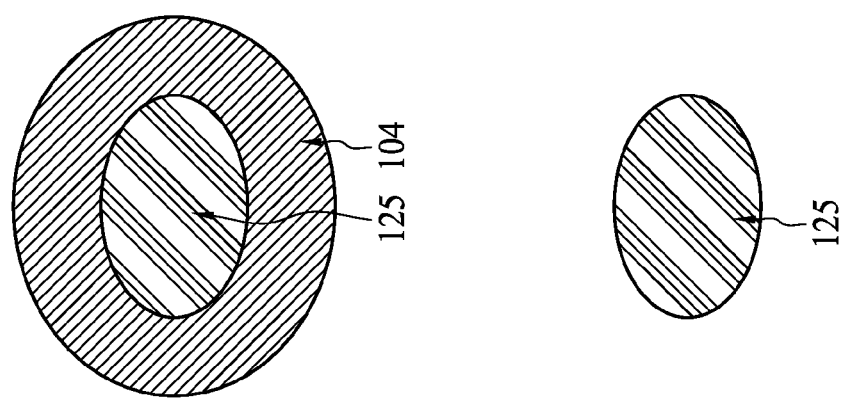
FIG. 2C
FIG. 2D

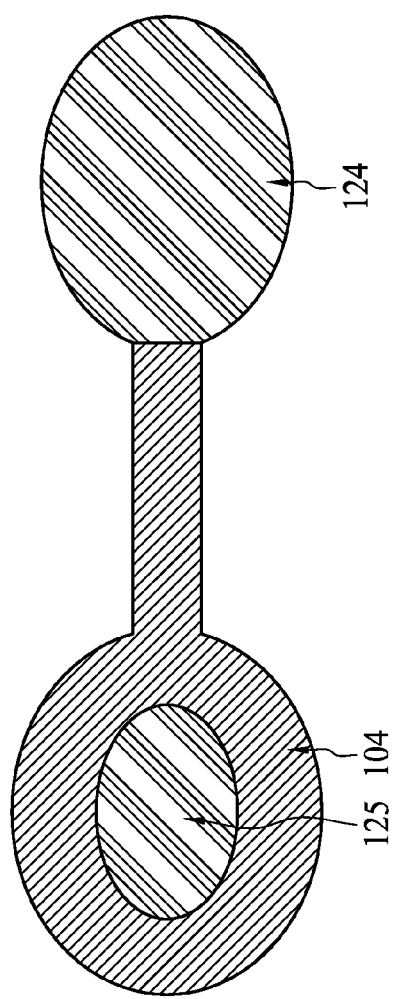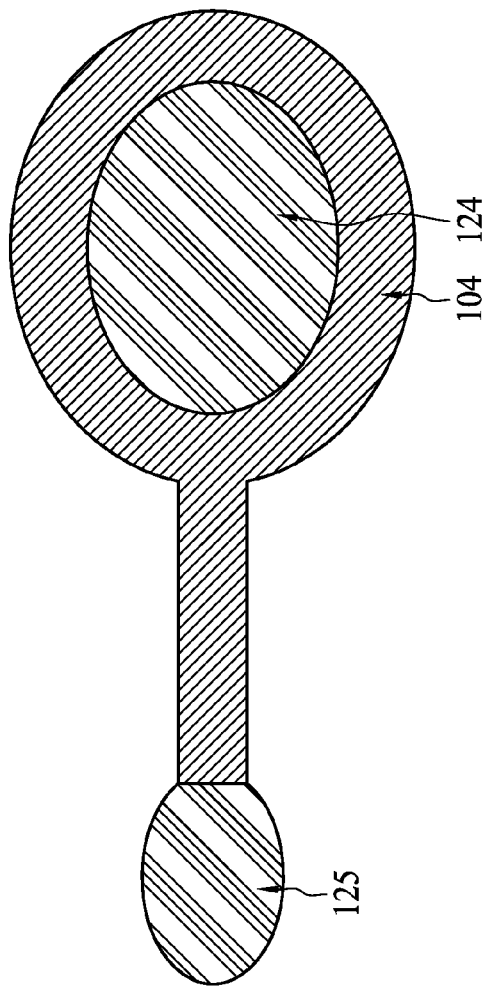
FIG. 2E
FIG. 2F

CONDUCTION LAYER FOR STACKED CIS CHARGING PREVENTION

FIELD

The present disclosure relates to a semiconductor image sensing device.

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors that can absorb radiation projected toward the substrate and convert the sensed radiation into electrical signals.

A backside illuminated (BSI) image sensor device is one type of image sensor device. As the size of transistor devices shrink with each technology generation, existing BSI image sensor devices may begin to suffer from issues related to cross-talk and blooming. These issues may be caused by insufficient isolation between neighboring pixels of the BSI image sensor. Therefore, while existing methods of fabricating BSI image sensor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F are cross-sectional views illustrating a structure of a conductive liner in accordance with some embodiments.

DETAILED DESCRIPTION

Figure 1:
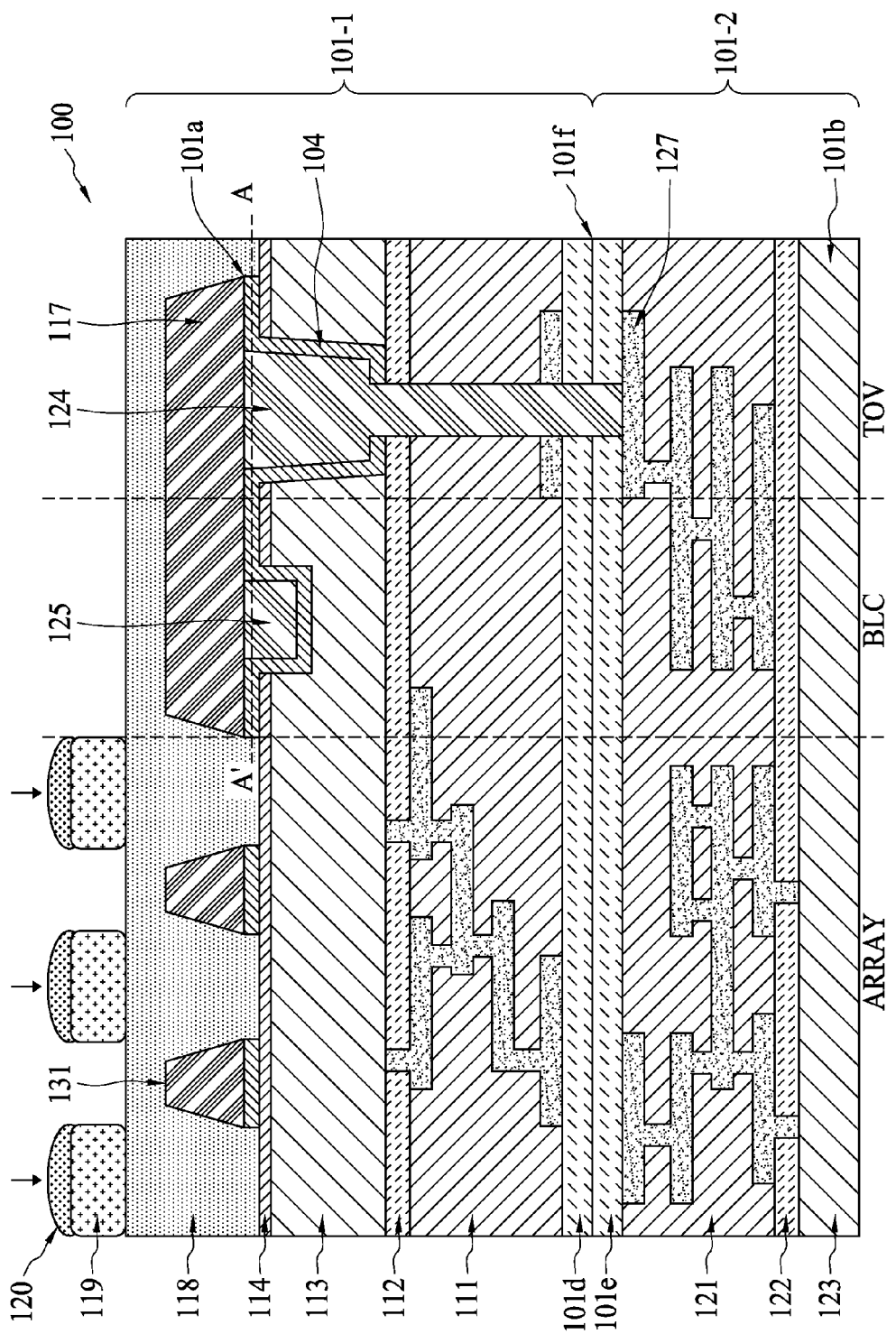
FIGS. 1 and 1A are cross-sectional views illustrating a backside illuminated (BSI) image sensor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A semiconductor device is manufactured by a number of operations. During the manufacturing, an electrical interconnection structure is formed between a number of conductive metallic structures across a number of insulating layers of at least two semiconductor chips in the semiconductor device. The conductive metallic structures are connected with each other by piercing a number of trenches or vias from a semiconductor chip to another semiconductor chip. The trench is formed by etching through the semiconductor chips. The trench is then coated or filled with a conductive material so that the conductive metallic structures are electrically connected across the semiconductor chips through the trench coated or filled with the conductive material.

However, during process of manufacturing the above-mentioned semiconductor device, schottky contact may occur on a grounding contact of the semiconductor device. Charges remain near an upper surface of a substrate of a semiconductor chip and thus a leakage current is formed which degrades the reliability of the semiconductor device. To reduce the leakage current, new structures of a BSI semiconductor device are illustrated as follows.

The manufacturing and use of the embodiments of the present disclosure are discussed in detail below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor device with an improved electrical interconnection structure is disclosed. The electrical interconnection structure includes a through via (TOV) which is coated with a dielectric layer in order to connect a first metallic structure to a second metallic structure for directing charges remaining in a first substrate to ground and thus reduce a leakage current of the semiconductor device.

FIG. 1 is a cross-sectional view illustrating a BSI image sensor device 100 in accordance with some embodiments of the present disclosure. The BSI image sensor device 100 includes various features such as a first semiconductor chip 101-1 and a second semiconductor chip 101-2. The first semiconductor chip 101-1 and the second semiconductor chip 101-2 are bonded and electrically interconnected by a first conductive plug 124. An interface 101f is between the first semiconductor chip 101-1 and the second semiconductor chip 101-2. The first conductive plug 124 includes conductive material. A first metallic structure 117 of the first semiconductor chip 101-1 is on a first surface 101a of the first semiconductor chip 101-1, wherein the first surface 101a is opposite to the interface 101f. The first metallic structure 117 is in contact with the first conductive plug 124. The first conductive plug 124 is above and in contact with a second metallic structure 127 of the second semiconductor chip 101-2. In other words, the first metallic structure 117 of the first semiconductor chip 101-1 interconnects with the second metallic structure 127 of the second semiconductor chip 101-2. A second conductive plug 125 extends from the first surface 101a and towards a first substrate 113 of the first metallic structure 101-1. In some embodiments, the second conductive plug 125 is in contact with the first substrate 113. A conductive liner 104 is disposed along a sidewall of the first conductive plug 124 or the second conductive plug 125. Therefore, the first substrate 113 is electrically connected to the second conductive plug 125. A plurality of metal grids 131 and the first metallic structure 117 are disposed in a dielectric layer 118. Color filters 119 and micro lenses 120 are arranged to be inside openings of the plurality of metal grids.

In first semiconductor chip 101-1, various features are included and disposed between the interface 101f and the first surface 101a. For example, there is an IMD (Inter Metallic Dielectric) layer 111 proximal to the interface 101f and some conductive traces laid in two or three dimensions are embedded in the IMD layer 111. Between the IMD layer 111 and the first surface 101a, other dielectric material, such as an ILD (Inter Layer Dielectric) layer 112, is disposed. A first substrate 113 is arranged to be adjacent to the ILD layer 112. The first substrate 113 may include some devices such as photodiodes and transistors.

In some embodiments, the first semiconductor chip 101-1 is configured as an image sensing chip. Some optical devices such as micro lenses 120 and color filters 119 are disposed over the first surface 101a in order to receive incident lights. For some embodiments, the first surface 101a is also called a backside of the first semiconductor chip 101-1 such that the first semiconductor chip 101-1 is designed to be a backside illuminated (BSI) image sensor device.

Some structures are introduced into the first semiconductor chip 101-1 in order to enhance the performance. For example, a high-k material used as an anti-reflective coating (ARC) 114 is disposed between the first substrate 113 and the first surface 101a.

In some embodiments, the first semiconductor chip 101-1 is a semiconductor image sensor chip and comprises an array region, a black level collection (BCL) region and a TOV region. In some embodiments, the first semiconductor chip 101-1 is fabricated by a CMOS process technique and configured for capturing a light and converting the light into an electrical signal. In some embodiments, the first metallic structure 117 is disposed over the BCL region of the first semiconductor chip 101-1. The first metallic structure 117 is configured to block ambient lights entering into the first semiconductor chip 101-1 in order to eliminate noise generated in the BCL.

In some embodiments, the first substrate 113 of the first semiconductor chip 101-1 includes silicon, germanium, gallium, arsenic, and combinations thereof. In some embodiments, the first substrate 113 is in a form of an SOI including a layer of a semiconductor material (e.g., silicon, germanium and/or the like) formed above an insulator layer (e.g., buried oxide and/or the like). In some embodiments, the first substrate 113 includes multi-layered substrates, gradient substrates, hybrid orientation substrates, any combinations thereof and/or the like.

In some embodiments, the first semiconductor chip 101-1 and the second semiconductor chip 101-2 are bonded together through any suitable bonding techniques, such as direct bonding. In some embodiments, the first semiconductor chip 101-1 and the second semiconductor chip 101-2 are bonded together by a metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof and/or the like.

In some embodiments, various features are included and disposed between the interface 101f and a second surface 101b. For example, there is a second IMD layer 121 proximal to the interface 101f and some conductive traces laid in two or three dimensions are embedded in the second IMD layer 121. Between the second IMD layer 121 and the second surface 101b, other dielectric materials, such as a second ILD layer 122, are disposed. In some embodiments, a second substrate 123 is arranged to be proximal to the second surface 101b, and the second substrate 123 includes silicon, germanium, gallium, arsenic, and combinations thereof. In some embodiments, the second substrate 123 is in a form of an SOI. In some embodiments, the second substrate 123 is multi-layered substrates, gradient substrates, hybrid orientation substrates, any combinations thereof and/or the like.

In some embodiments, the first IMD layer 111 and the second IMD layer 121 respectively include a dielectric material for isolating metallic structures inside the first IMD layer 111 and the second IMD layer 121. In some embodiments, the first IMD layer 111 and the second IMD layer 121 include various dielectric materials used in integrated circuit fabrication. In some embodiments, the first IMD layer 111 and the second IMD layer 121 include silicon dioxide, silicon nitride or a doped glass layer such as boron silicate glass, black diamond, silicon carbide, and the like. In some embodiments, the first IMD layer 111 and the second IMD layer 121 are formed using suitable techniques such as oxidation, CVD and/or the like.

In some embodiments, the second semiconductor chip 101-2 is a semiconductor ASIC chip which is configured for a particular application. In some embodiments, the second semiconductor chip 101-2 includes several logic circuits such as an analog-to-digital converter, a data processing circuit, a memory circuit, a bias circuit, a reference circuit, any combinations thereof and/or the like.

In some embodiments, the second metallic structure 127 of the second semiconductor chip 101-2 is disposed within the second IMD layer 121. In some embodiments, the second metallic structure 127 includes gold, silver, copper, nickel, tungsten, aluminum, palladium, and/or alloys thereof.

In some embodiments, the interface 101f is between a passivation layer 101d of the first semiconductor chip 101-1 and a passivation layer 101e of the second semiconductor chip 101-2. In some embodiments, the passivation layer 101d and the passivation layer 101e respectively include silicon oxide, silicon nitride, and can be a composite structure, hybrid bond, bonding interface including metal such as copper, and dielectric such as silicon oxide or silicon nitride.

The first and second semiconductor chips are electrically connected by the first conductive plug 124. The first conductive plug 124 extends from the first surface 101a of the first semiconductor chip 101-1 into the second semiconductor chip 101-2. For some embodiments, the first metallic structure 117 is electrically connected with the second metallic structure 127 by the first conductive plug 124. For some embodiments, one end of the first conductive plug 124 lands on the second metallic structure 127. The first metallic structure 117 is substantially coplanar with a metal grid of the first semiconductor chip 101-1, wherein the metal grids are configured to be over a plurality of image pixels (not shown) in the first substrate 113.

The depth of the first conductive plug 124 varies depending on different applications and design needs. In some embodiments, the through via has a depth greater than about 4.0 um. The first conductive plug 124 includes gold, silver, copper, nickel, tungsten, aluminum, palladium, and/or alloys thereof.

In some embodiments, a conductive liner 104 is disposed in the first semiconductor chip 101-1 as a liner adjacent to the first conductive plug 124 and the second conductive plug 125. In some embodiments, the conductive liner is between the first conductive plug 124 and the first substrate 113. In some embodiments, the conductive liner is between the second conductive plug 125 and the first substrate 113. An electric current passing through the first conductive plug 124 or the second conductive plug 125 is ensured to travel between the first and second semiconductor chip. A lateral shortage path within the first semiconductor chip 101-1 can be avoided. The conductive liner 104 is not limited to be continuous. The conductive liner 104 may be disposed only along a sidewall of the first conductive plug or only along a sidewall of the second conductive plug. In some embodiments, the depth of the first conductive plug 124 and the second conductive plug 125 are different.

In some embodiments, the conductive liner 104 includes a conductive material such as tungsten, tantalum (Ta) or the alloy thereof. In some embodiments, electrical conductivity of the conductive liner 104 is different from the first conductive plug 124 or the second conductive plug 125. In some embodiments, electrical conductivity of the conductive liner 104 is greater than the first conductive plug 124 or the second conductive plug 125. In some embodiments, the thickness of the conductive liner 104 is between about 100 Å and about 700 Å. In some embodiments, the conductive liner 104 is formed using suitable techniques such as sputtering, oxidation or CVD, etc.

In some embodiment, during process of manufacturing the first conductive plug 124 or the second conductive plug 125, charges are directed to the second metallic structure 127 through the first conductive plug 124 or directed to the first substrate 113 through the second conductive plug 125. By using the new structure illustrated in FIG. 1, charges would no accumulate in the first conductive plug 124 or the second conductive plug 125 and thus, damage during the process of manufacturing the first conductive plug 124 or the second conductive plug 125 are avoided, so as to decrease the possibility of plasma induced charge (PID) failure.

Figure 1A:
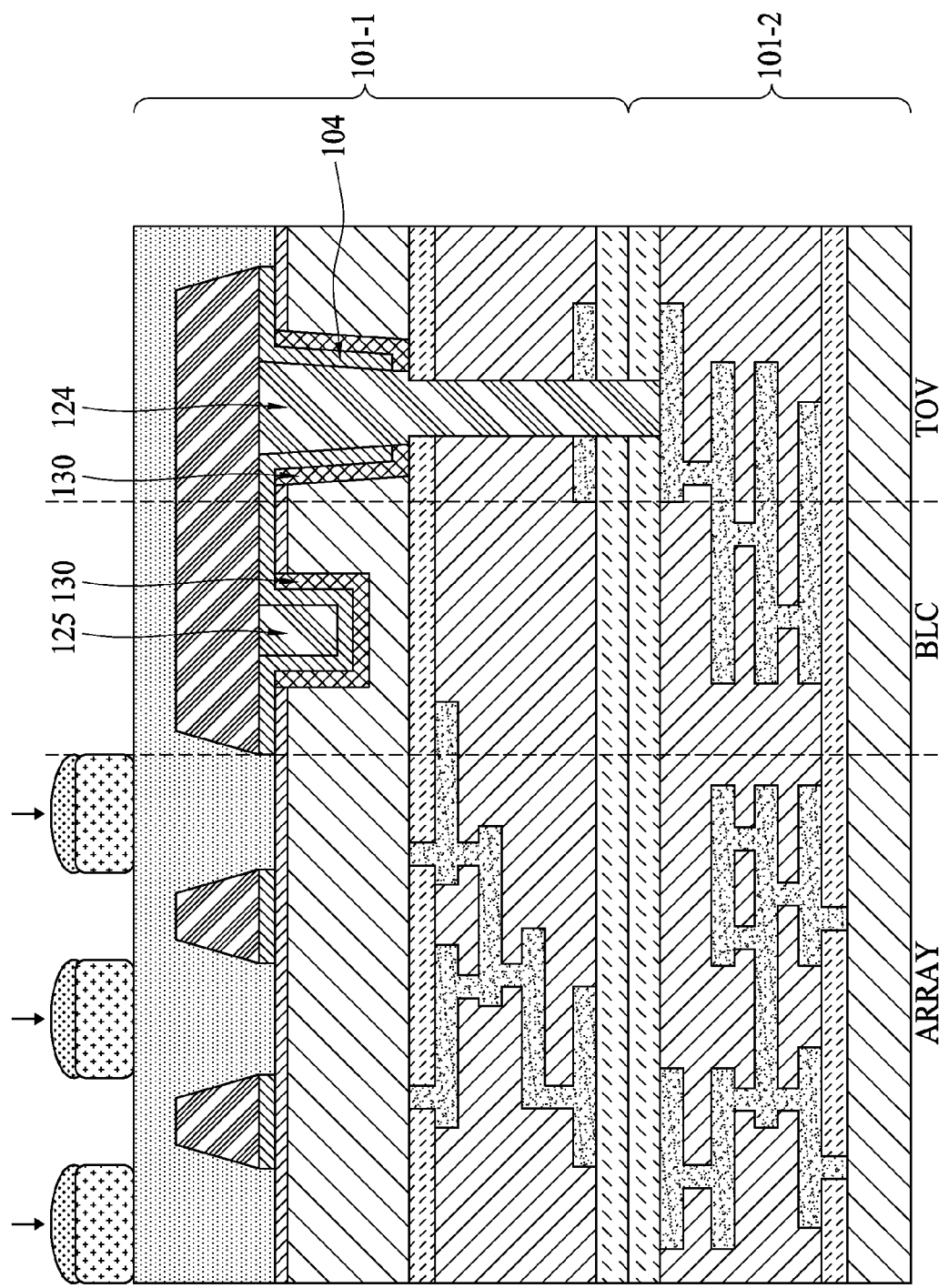

In some embodiments, referring to FIG. 1A, a seed layer 130 is disposed along the sidewall of the first conductive plug or the second conductive plug. The seed layer 130 is a conductive material for electroplating the conductive liner 104, such as copper or tantalum. The conductive liner 104 is disposed in the first semiconductor chip 101-1 as a liner adjacent to the first conductive plug 124 and the second conductive plug 125. In some embodiments, the conductive liner is between the first conductive plug 124 and the seed layer 130. In some embodiments, the conductive liner 104 is between the second conductive plug 125 and the seed layer 130. In some embodiments, the seed layer 130 includes a conductive material such as tantalum (Ta) or other materials. In some embodiments, the thickness of the seed layer 130 is between about 400 Å and about 700 Å. In some embodiments, the seed layer 130 is formed using suitable techniques such as sputtering, oxidation or CVD, etc.

FIGS. 2A-2F are different cross-sectional profiles along line AA' of FIG. 1. From a top view of the cross-sectional view of the BSI image sensor device 100 as shown in FIG. 1, the conductive liner 104 and the conductive material filled in the first conductive plug 124 or the second conductive plug 125 are coaxial as shown in FIGS. 2A-2F. The conductive liner 104 can be continuous or discontinuous. Referring to FIG. 2A, the conductive liner 104 is disposed in the first conductive plug 124 and the second conductive plug 125 and the continuous region connecting the first conductive plug 124 and the second conductive plug 125. Referring to FIG. 2B, the conductive liner 104 is only disposed in the first conductive plug 124 and the second conductive plug 125. Referring to FIG. 2C, the conductive liner 104 is only disposed in the second conductive plug 125. Referring to FIG. 2D, the conductive liner is only disposed in the first conductive plug 124. Referring to FIG. 2E, the conductive liner is disposed in the second conductive plug 125 and the continuous region connecting the first conductive plug 124 and the second conductive plug 125. Referring to FIG. 2F, the conductive liner 104 is disposed in the first conductive plug 124 and the continuous region connecting the first conductive plug 124 and the second conductive plug 125. The arrangement of the conductive liner 104 illustrated in FIGS. 2A-2F is interchangable and not deemed as a limitation.

Figure 3:
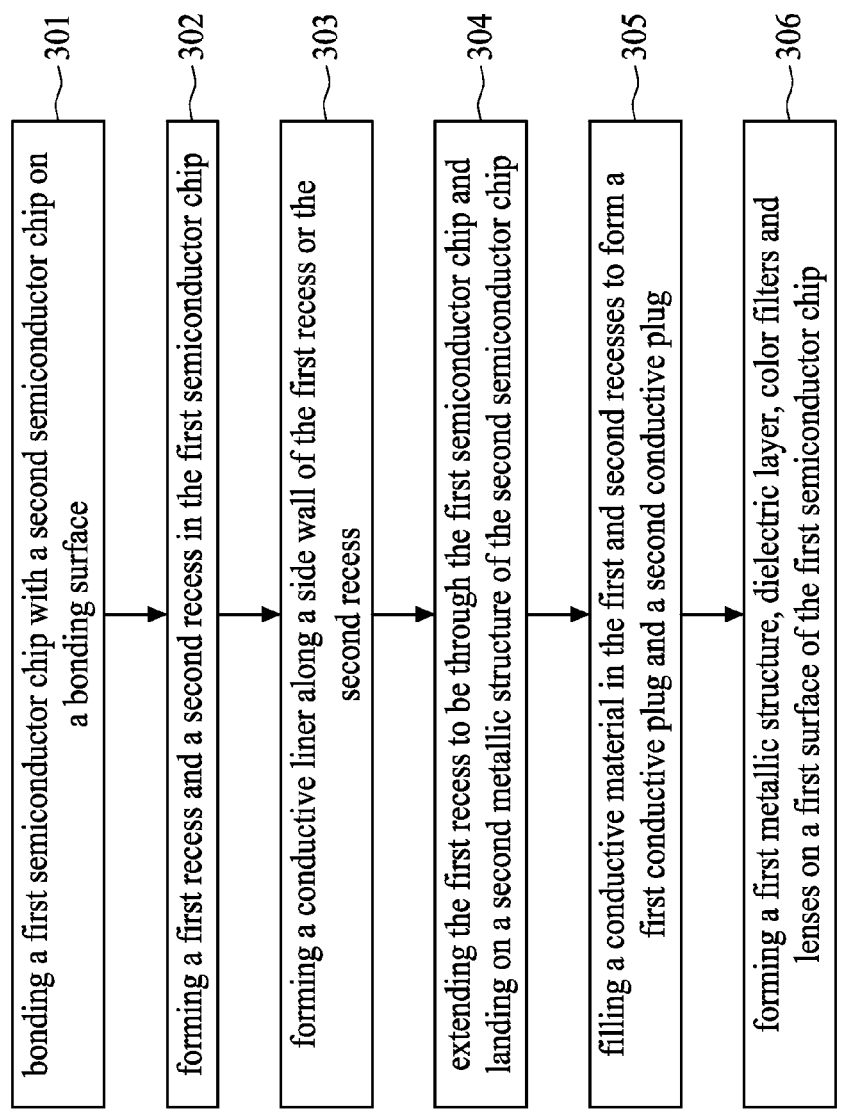
FIG. 3 is a flow diagram of a method of manufacturing a semiconductor device in accordance with FIG. 1 of the present disclosure.
Figure 3A:
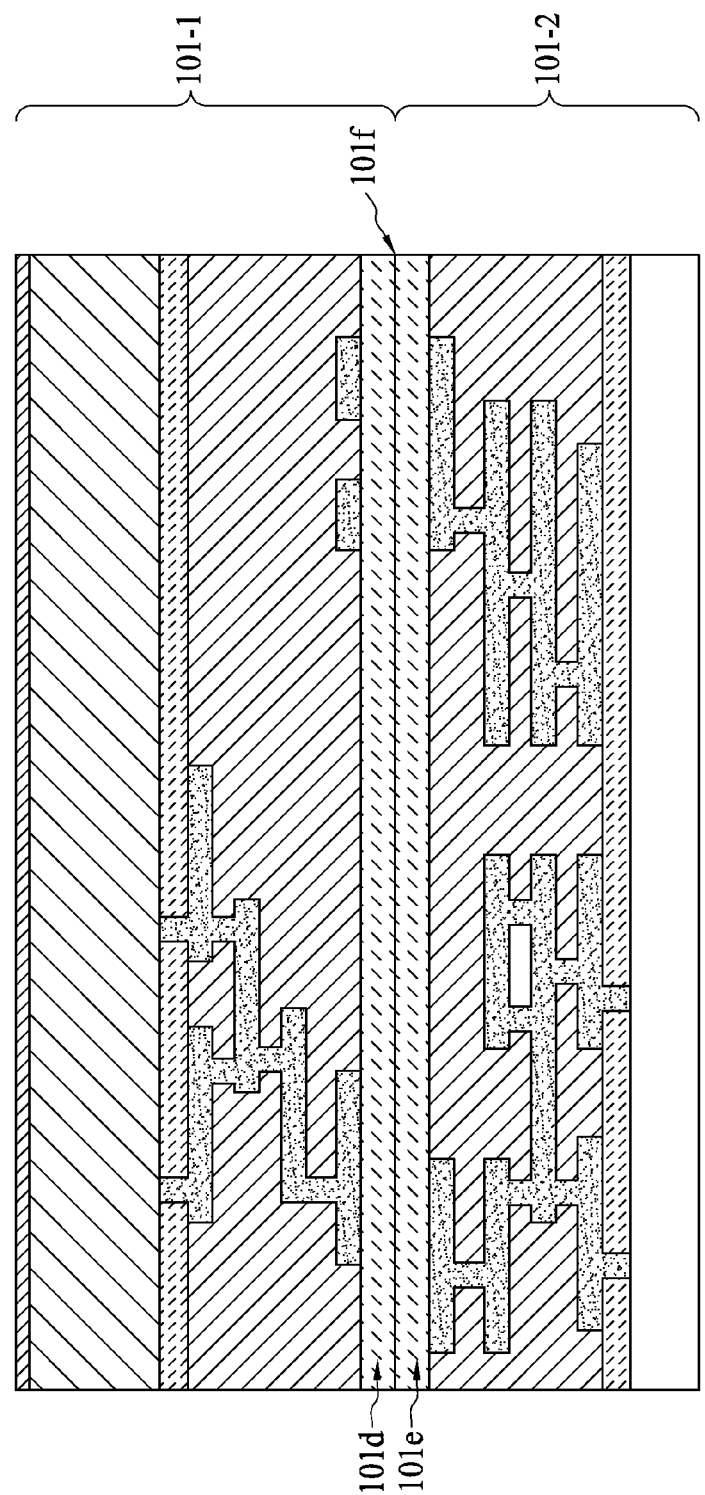
FIGS. 3A-3F represent a method of manufacturing a backside illuminated (BSI) image sensor device in accordance with FIG. 1 of the present disclosure.

FIG. 3 is a flowchart of a method 300 of manufacturing a semiconductor device 100 as shown in FIG. 1. The method 300 includes a number of operations. In operation 301, a first semiconductor chip 101-1 and a second semiconductor chip 101-2 are provided as in FIG. 3A. In some embodiments, the first semiconductor chip 101-1 and the second semiconductor chip 101-2 are bonded together through any suitable bonding techniques, such as direct bonding. In some embodiments, the first semiconductor chip 101-1 and the second semiconductor chip 101-2 are bonded at an interface 101f between the passivation layer 101d of the first semiconductor chip 101-1 and the passivation layer 101e of the second semiconductor chip 101-2. For some examples, there are a few types of bonding techniques available for operation 301. One type is called adhesive bonding in which an intermediate layer is introduced to connect the first and second semiconductor chip. The intermediate layer can be optionally kept on the interface 101f. Another type is called direct bonding in which a suitable energy (such as heat, laser, etc.) is introduced to connect the first and second semiconductor chip through a certain transformation of the bonding surfaces. In FIG. 3A, the first semiconductor chip 101-1 and the second semiconductor chip 101-2 are drawn to be directly bonded without mentioning an intermediate layer. However, it should not be treated that the adhesive bond is excluded in the present disclosure.

Figure 3B:
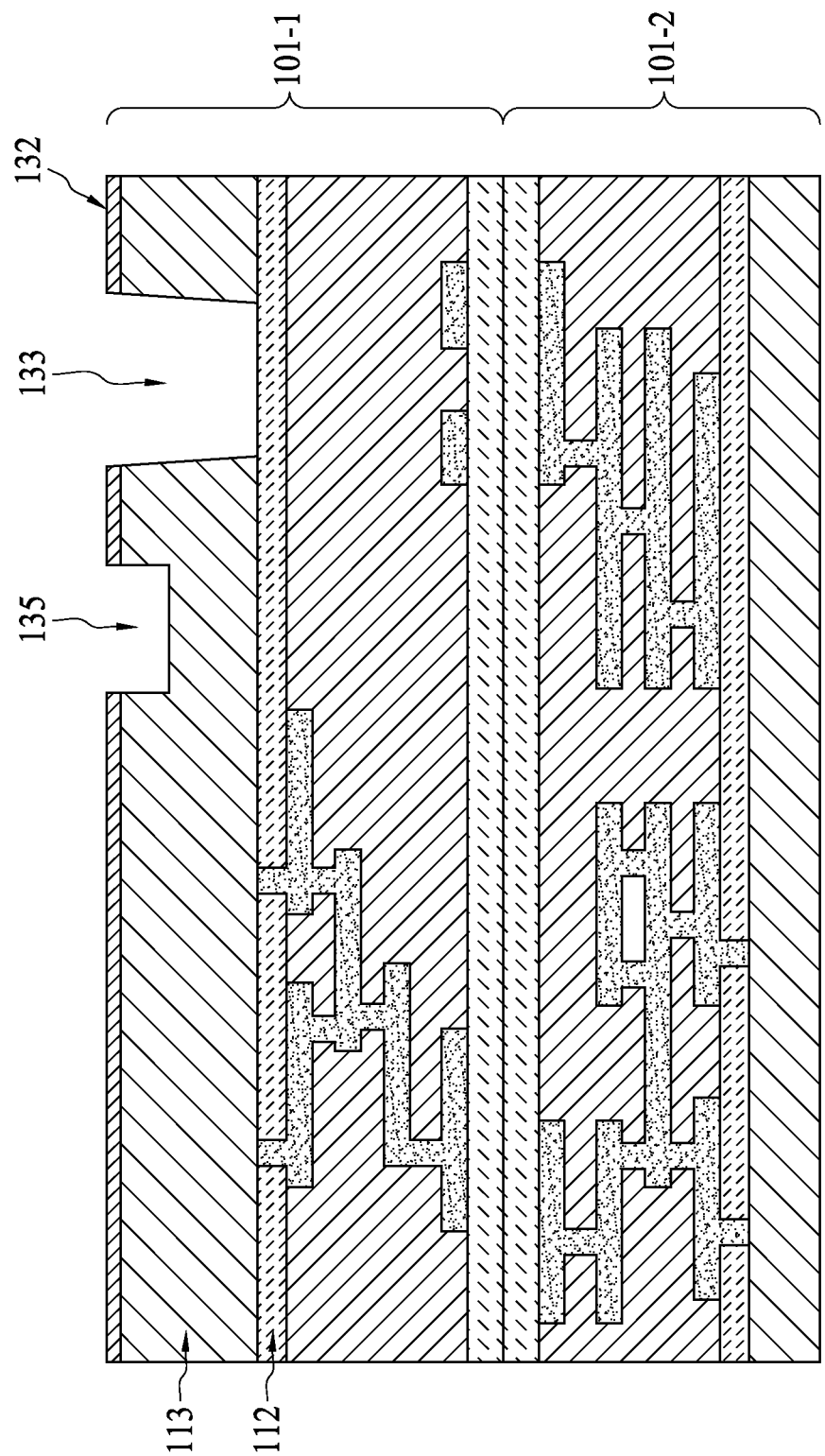

In operation 302, a first recess 133 and a second recess 135 are formed as in FIG. 3B. The first recess 133 extends from a top surface 132 of the first semiconductor chip 101-1 to a predetermined distance inside the first semiconductor chip 101-1. The second recess 135 extends from the top surface 132 of the first semiconductor chip 101-1 and protrudes into the first substrate 113 of the first semiconductor chip 101-1. In some embodiments, the predetermined distance is deeper than the second recess 135 and substantially equal to the thickness of the first substrate 113. In some other embodiments, the first recess 133 further extends into or beyond the ILD layer 112.

Figure 3C:
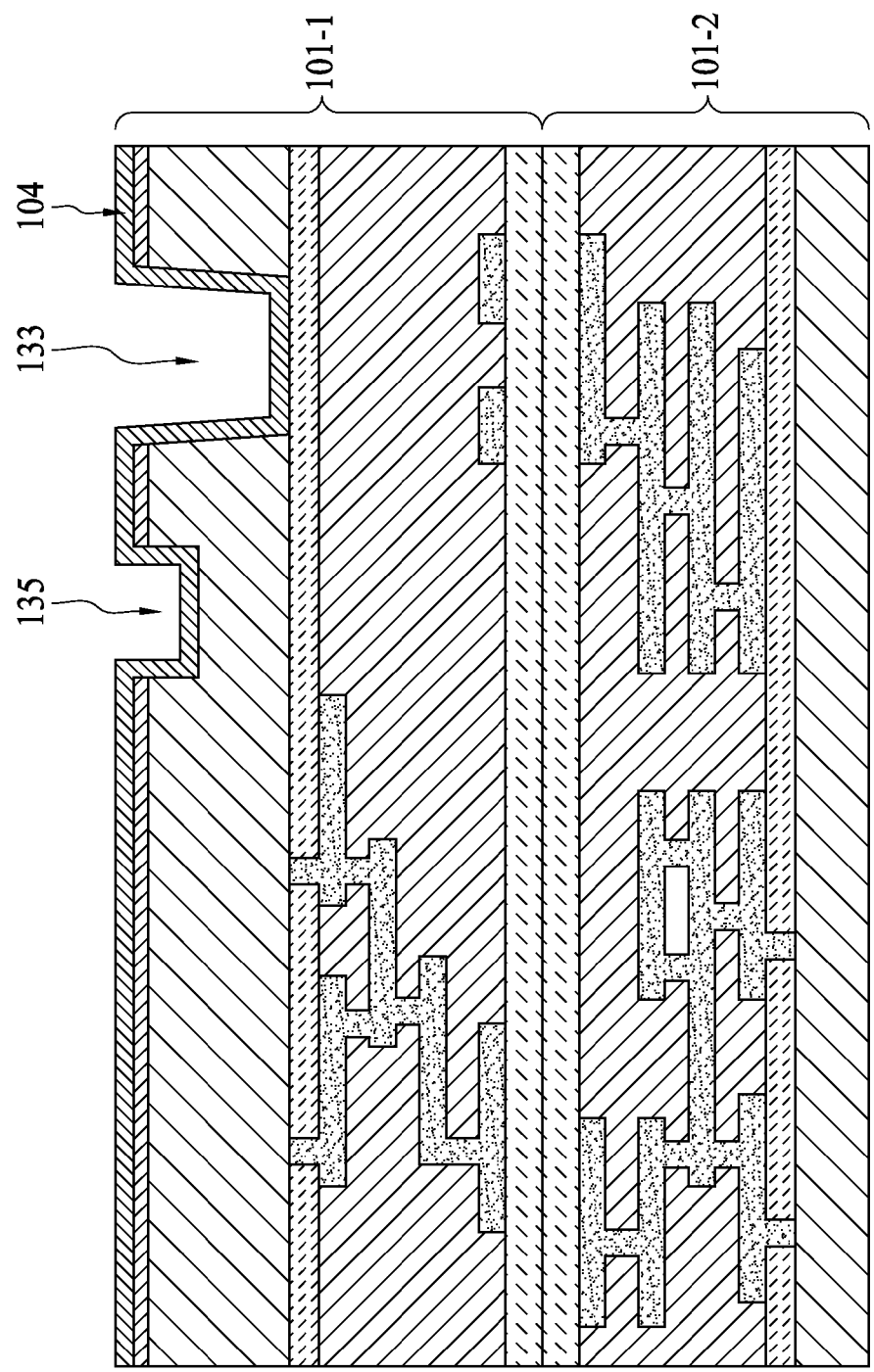

In operation 303, a conductive liner 104 is formed along a sidewall of the first recess 133 of the first semiconductor chip 101-1. The conductive liner 104 may also be formed along a sidewall of the second recess 135 as shown in FIG. 3C. The conductive liner 104 can be formed by any suitable film growth method such as electroplating or sputtering.

Figure 3D:
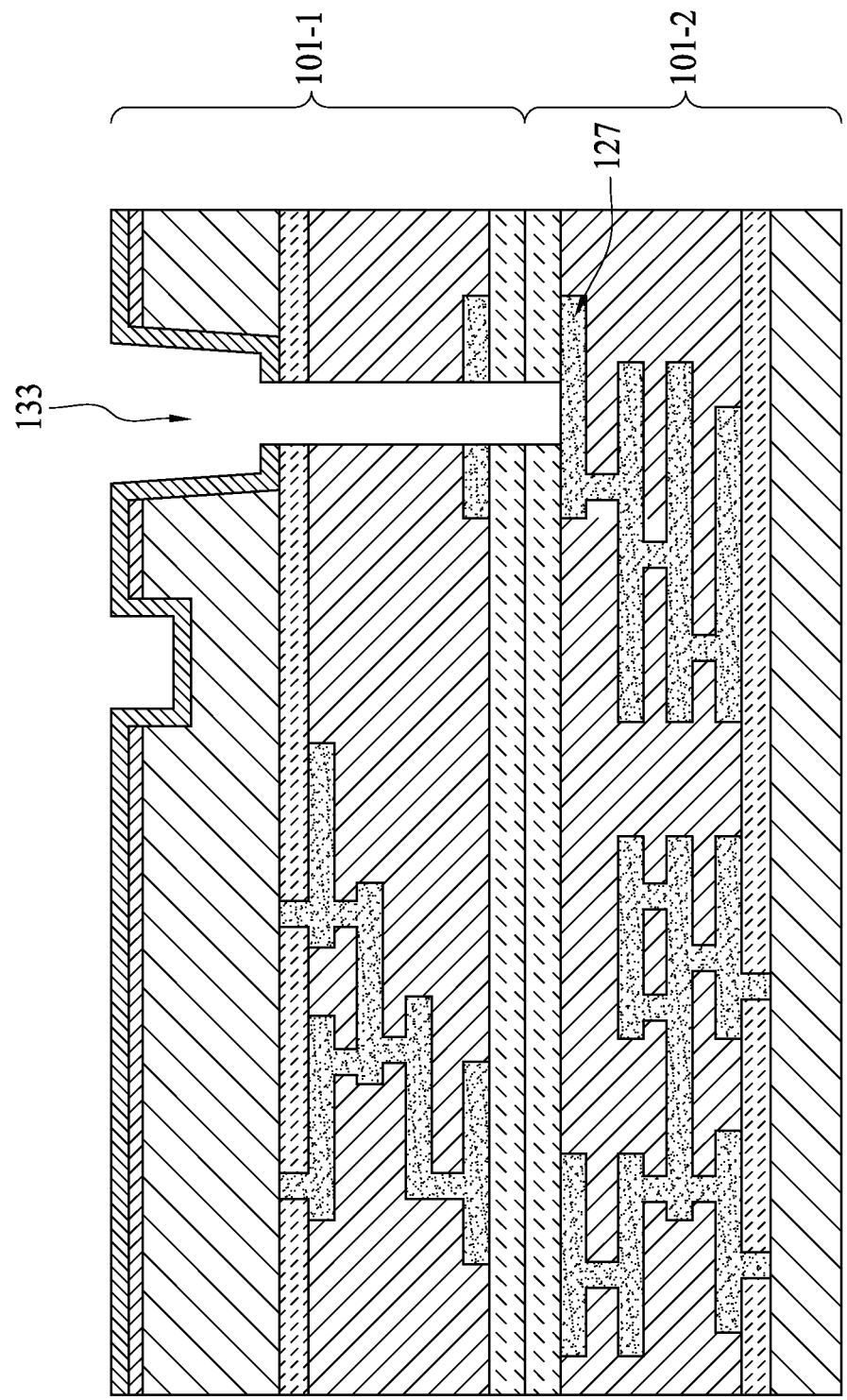

In operation 304, the first recess 133 further extends to be through the first semiconductor chip 101-1 and landing on a second metallic structure 127 of the second semiconductor chip 101-2 as shown in FIG. 3D. A via through the first semiconductor chip 101-1 and the second semiconductor chip 101-2 is formed at this operation. Operation 304 is also called a second drilling operation for the first recess 133, in which depth of the first recess 133 is further increased in order to extend into the second semiconductor chip 101-2. The drilling operation can be realized by various methods such as laser drill, chemical etch. In some embodiments, the hole formed during second drilling has a smaller diameter than that of the first recess 133 formed in operation 302.

Figure 3E:
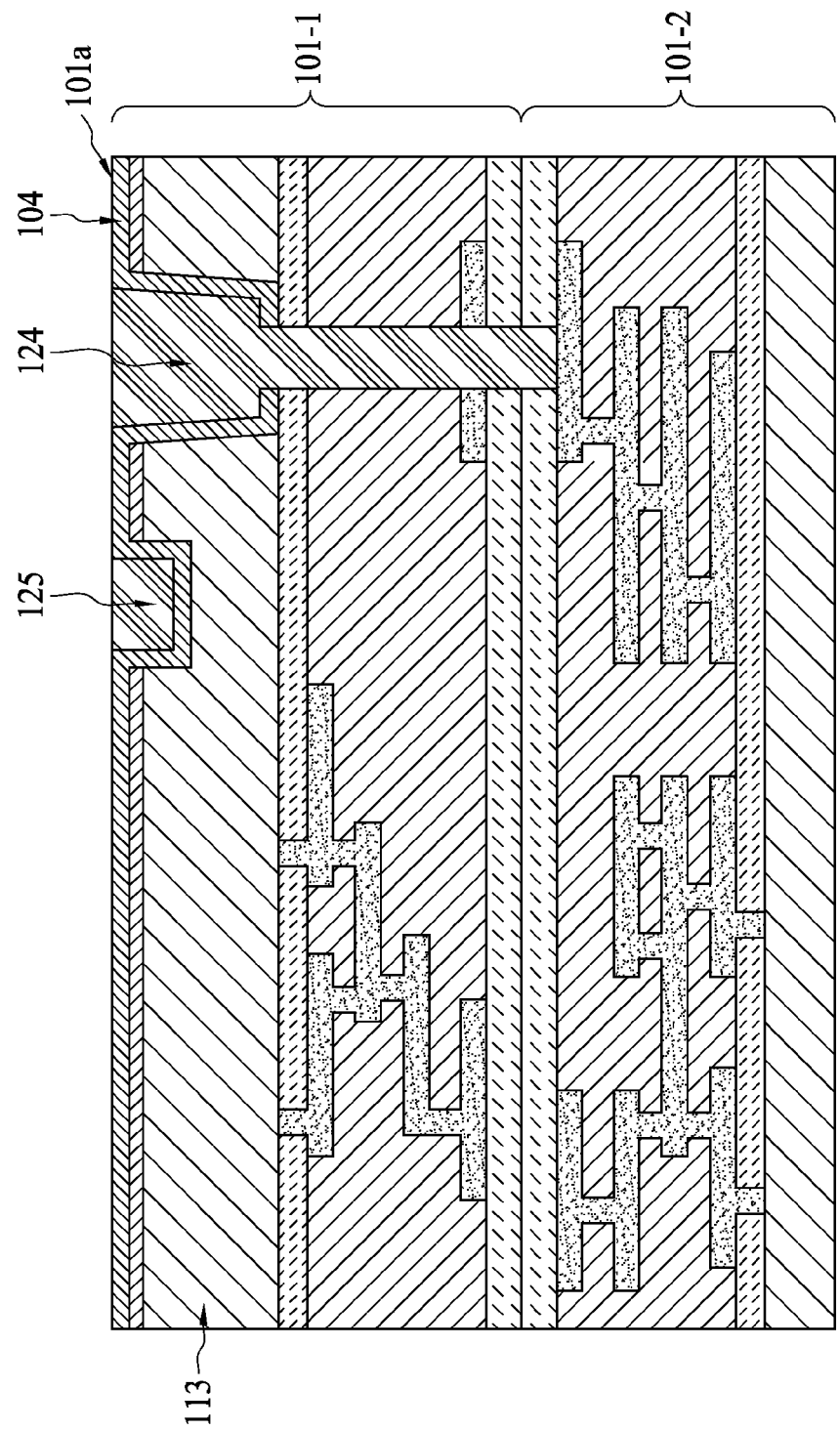

In operation 305, a conductive material fills in the first recess 133 and the second recess 135 so as to form a first conductive plug 124 and a second conductive plug 125 as in FIG. 3E. In some embodiments, there may be some excessive conductive materials disposed on the first surface 101a. An extra operation such as chemical mechanical planarization (CMP), etching or other methods is introduced to remove the excessive conductive materials from the first surface 101a.

In some embodiments, forming of the conductive liner 104 along a sidewall of the second recess 135 is prior to extending the first recess 133 to be through the first semiconductor chip 101-1. Charges generated during the second drilling operation are conducted to the second recess 135 through the conductive liner 104. The charges may be accumulated on any surface exposed under sources such as plasma during the second drilling operation. However, since the exposed surface is covered by the conductive liner 104, the charges can be released into the first substrate 113 through the second recess 135. In some embodiments, the first recess 133 and the second recess 135 are formed by anisotropical etching operations. In some embodiments, the first recess 133 and the second recess 135 are formed by suitable deposition and photolithography techniques such as a reactive ion etch (RIE) or other dry etch, an anisotropic wet etch, or any other suitable anisotropic etching.

Figure 3F:
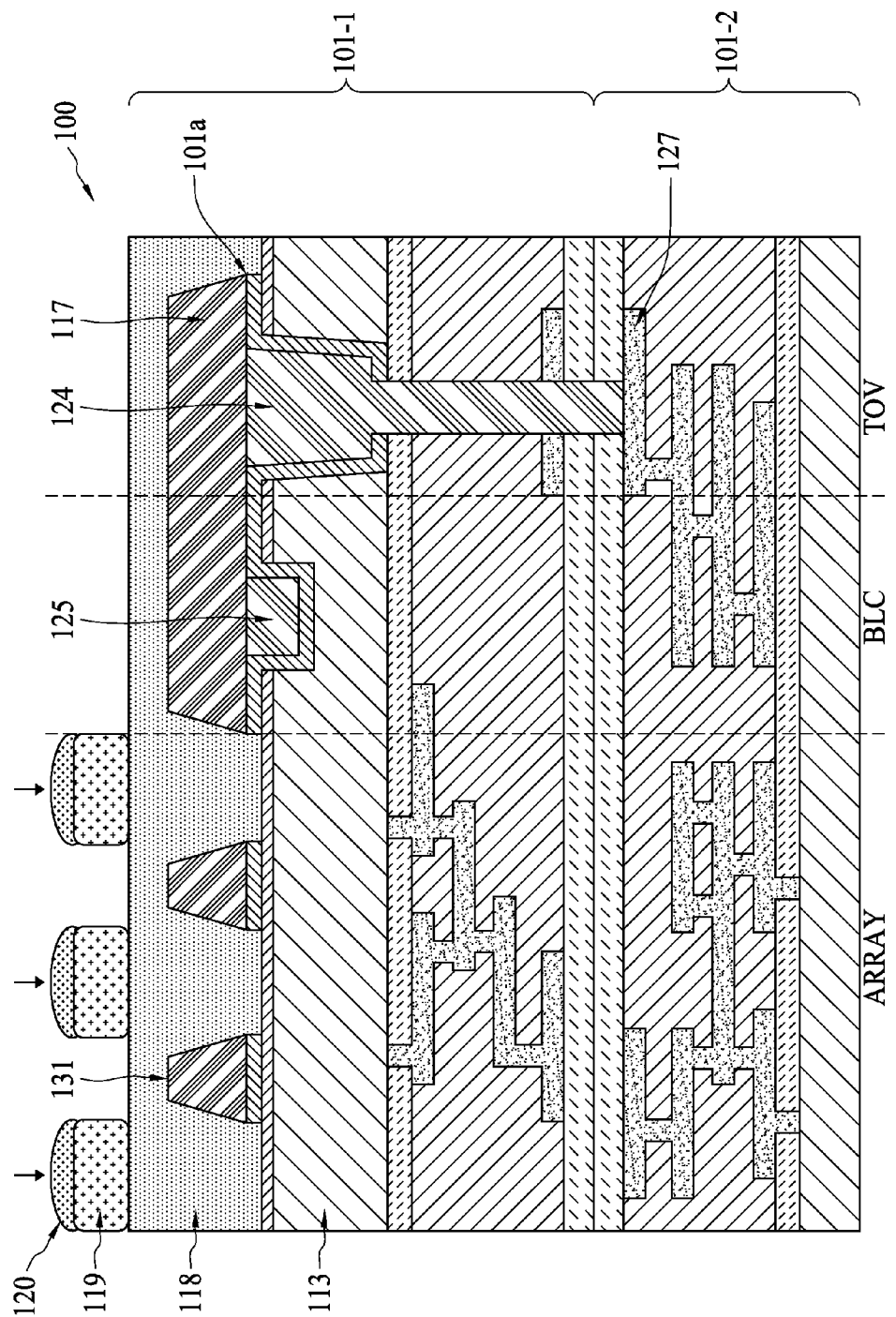

In operation 306, corresponding to FIG. 3F, the first metallic structure 117 is formed over the first surface 101a of the first semiconductor chip 101-1 and is then electrically connected with the second semiconductor chip 101-2 via the first conductive plug 124 extending from the first surface 101a of the first semiconductor 101-1 to the second metallic structure 127 of the second semiconductor chip 101-2. The second conductive plug 125 extends from the first surface 101a and protrudes into the first substrate 113 of the first semiconductor chip 101-1. A metal grid 131 is also formed simultaneously with the first metallic structure 117 and the metal grid 131 is in the array region of the first semiconductor chip 101-1. In some embodiments, the dielectric layer 118 is formed over the first semiconductor chip 101-1. Some of the dielectric layer 118 is removed by CMP or other methods. In some embodiments, color filters 119 are formed over the dielectric layer 118 and between the gaps of the metal grids. In some embodiments, micro lenses 120 are formed over the color filters.

Figure 4:
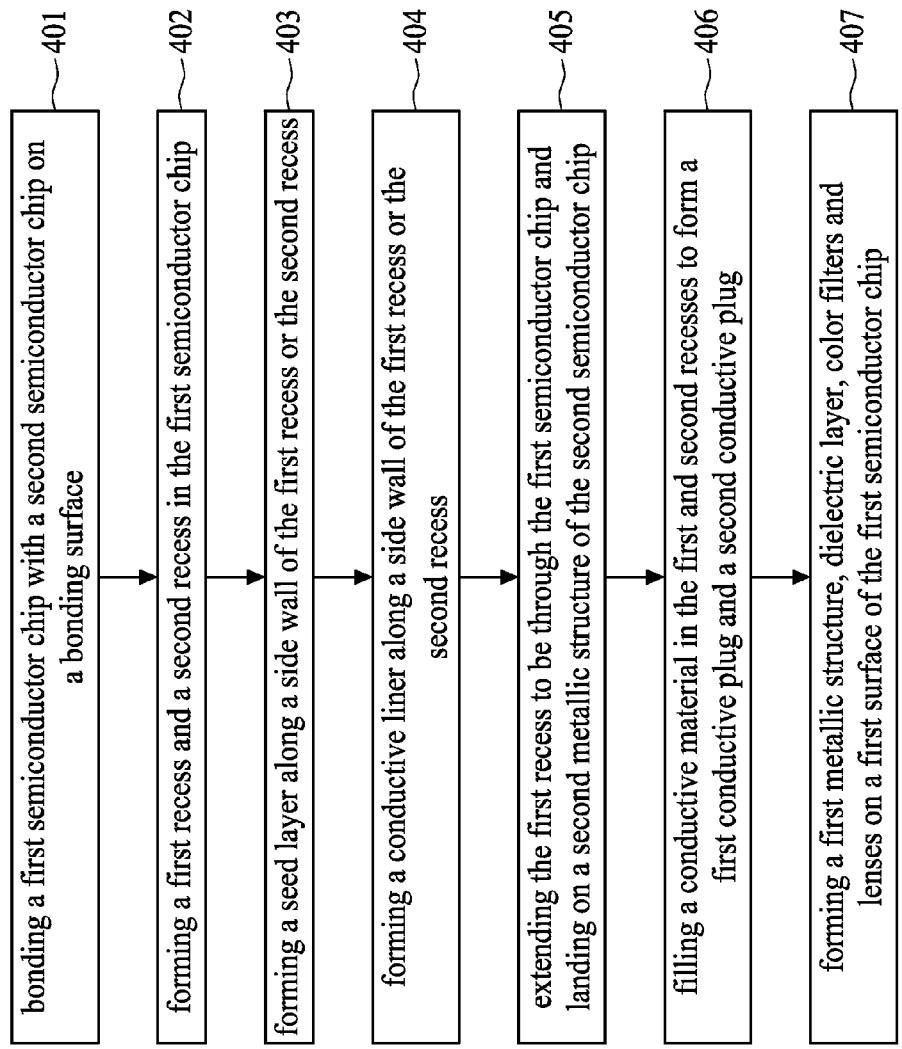
FIG. 4 is a flow diagram of a method of manufacturing a semiconductor device in accordance with FIG. 1A of the present disclosure.
Figure 4A:
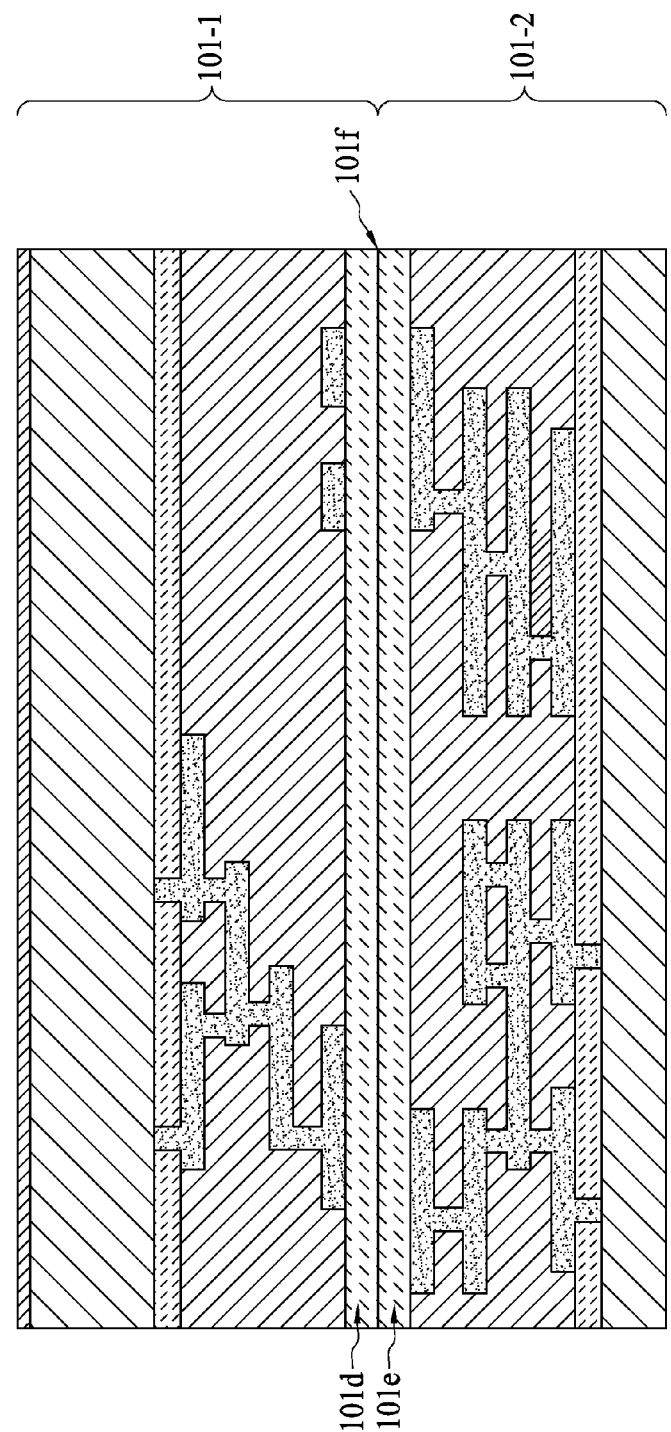
FIGS. 4A-4G represent a method of manufacturing a backside illuminated (BSI) image sensor device in accordance with FIG. 1A of the present disclosure.

FIG. 4 is a flowchart of a method 400 of manufacturing a semiconductor device 100 as shown in FIG. 1A. The method 400 includes a number of operations. In operation 401, a first semiconductor chip 101-1 and a second semiconductor chip 101-2 are provided as in FIG. 4A. In some embodiments, the first semiconductor chip 101-1 and the second semiconductor chip 101-2 are bonded together through any suitable bonding techniques, such as direct bonding. In some embodiments, the first semiconductor chip 101-1 and the second semiconductor chip 101-2 are bonded at the interface 101f between the passivation layer 101d of the first semiconductor chip 101-1 and the passivation layer 101e of the second semiconductor chip 101-2. For some examples, there are a few types of bonding techniques available for operation 401. One type is called adhesive bonding in which an intermediate layer is introduced to connect the first and second semiconductor chip. The intermediate layer can be optionally kept on the interface 101f. Another type is called direct bonding in which a suitable energy (such as heat, laser, etc.) is introduced to connect the first and second semiconductor chip through a certain transformation of the bonding surfaces. In FIG. 4A, the first semiconductor chip 101-1 and the second semiconductor chip 101-2 are drawn to be directly bonded without mentioning an intermediate layer. However, it should not be treated that the adhesive bond is excluded in the present disclosure.

Figure 4B:
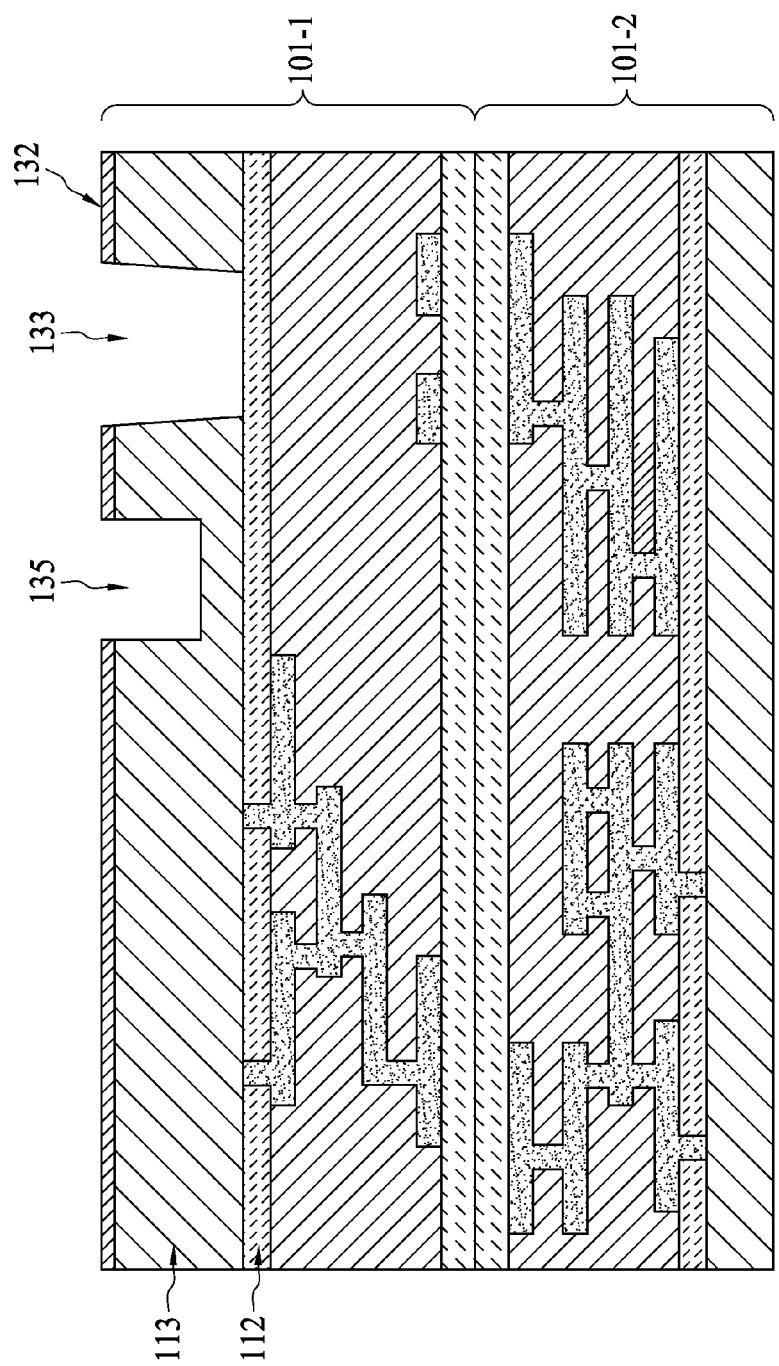

In operation 402, a first recess 133 and a second recess 135 are formed as in FIG. 4B. The first recess 133 extends from a top surface 132 of the first semiconductor chip 101-1 to a predetermined distance inside the first semiconductor chip 101-1. The second recess 135 extends from the top surface 132 of the first semiconductor chip 101-1 and protrudes into the first substrate 113 of the first semiconductor chip 101-1. In some embodiments, the predetermined distance is deeper than the second recess 135 and substantially equal to the thickness of the first substrate 113. In some other embodiments, the first recess 133 further extends into or beyond the ILD layer 112.

Figure 4C:
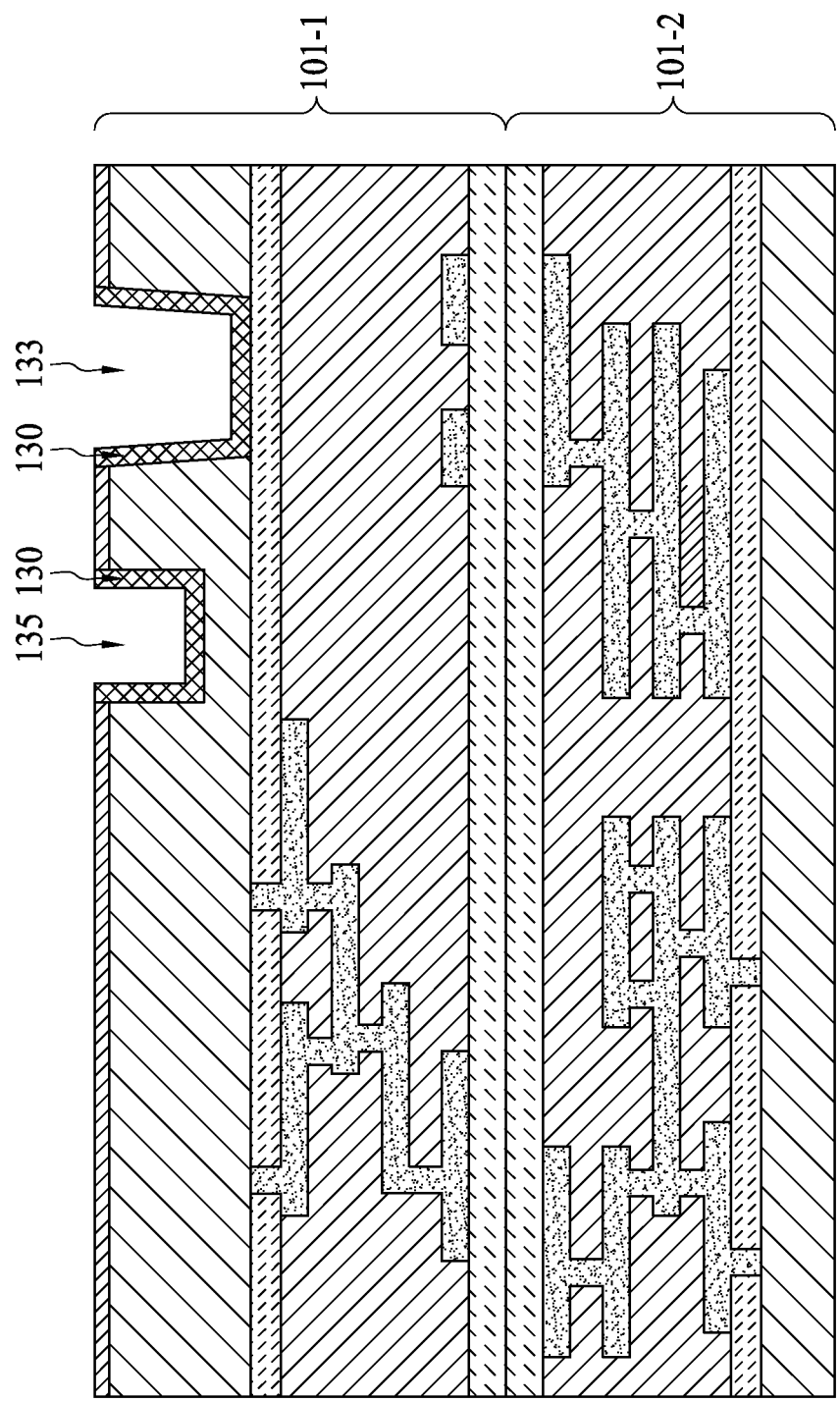

In operation 403, a seed layer 130 is formed along a sidewall of the first recess 133 or the second recess 135, as shown in FIG. 4C. In some embodiments, the seed layer 130 includes a conductive material such as tantalum (Ta) or other materials. In some embodiments, the thickness of the seed layer 130 is between about 400 Å and about 700 Å. In some embodiments, the seed layer 130 is formed using suitable techniques such as sputtering, oxidation or CVD, etc.

Figure 4D:
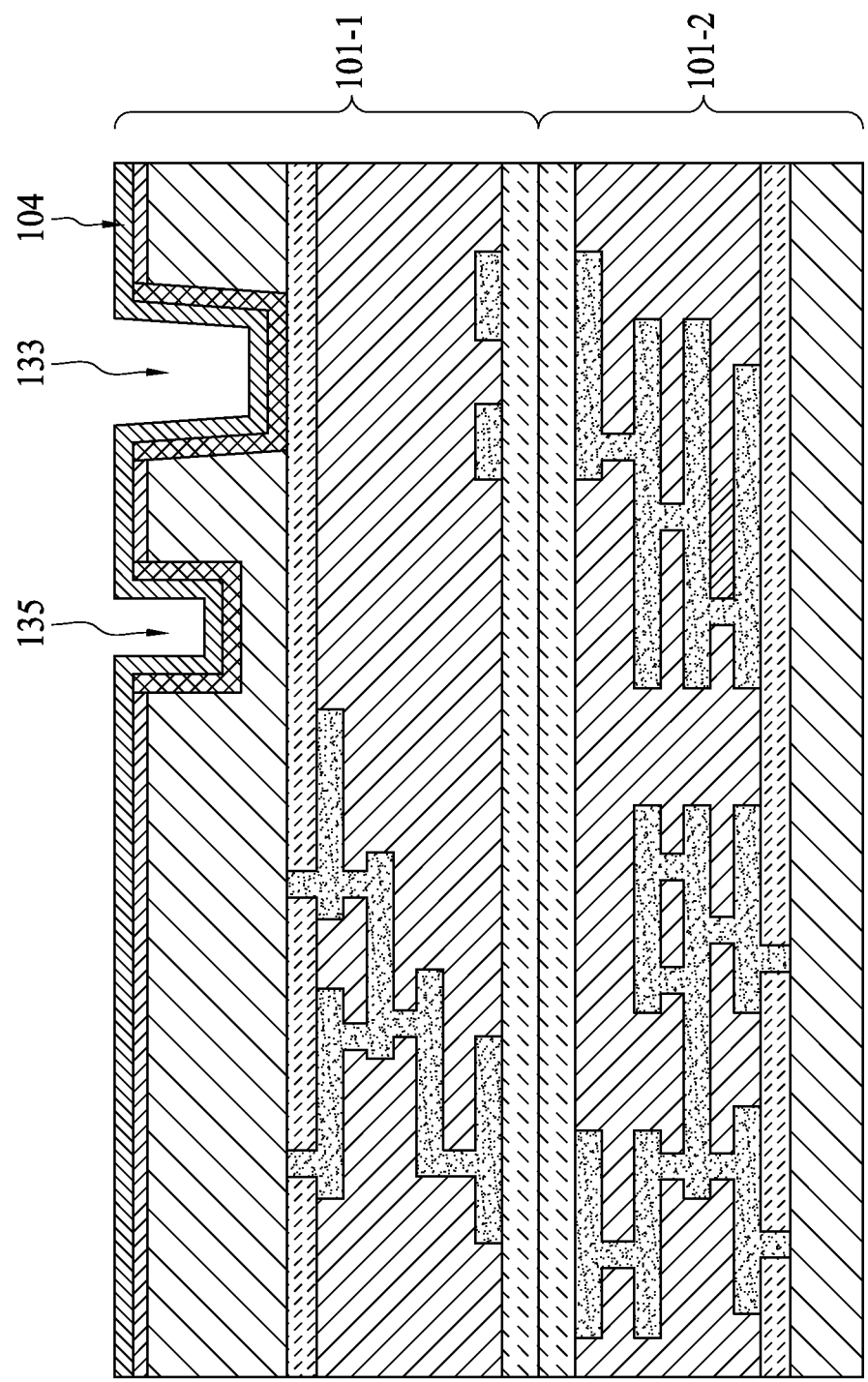

In operation 404, the conductive liner 104 is formed along a sidewall of the first recess 133 of the first semiconductor chip 101-1. The conductive liner 104 may also be formed along a sidewall of the second recess 135 as shown in FIG. 4D. The conductive liner 104 can be formed by any suitable film growth method such as electroplating or sputtering.

Figure 4E:
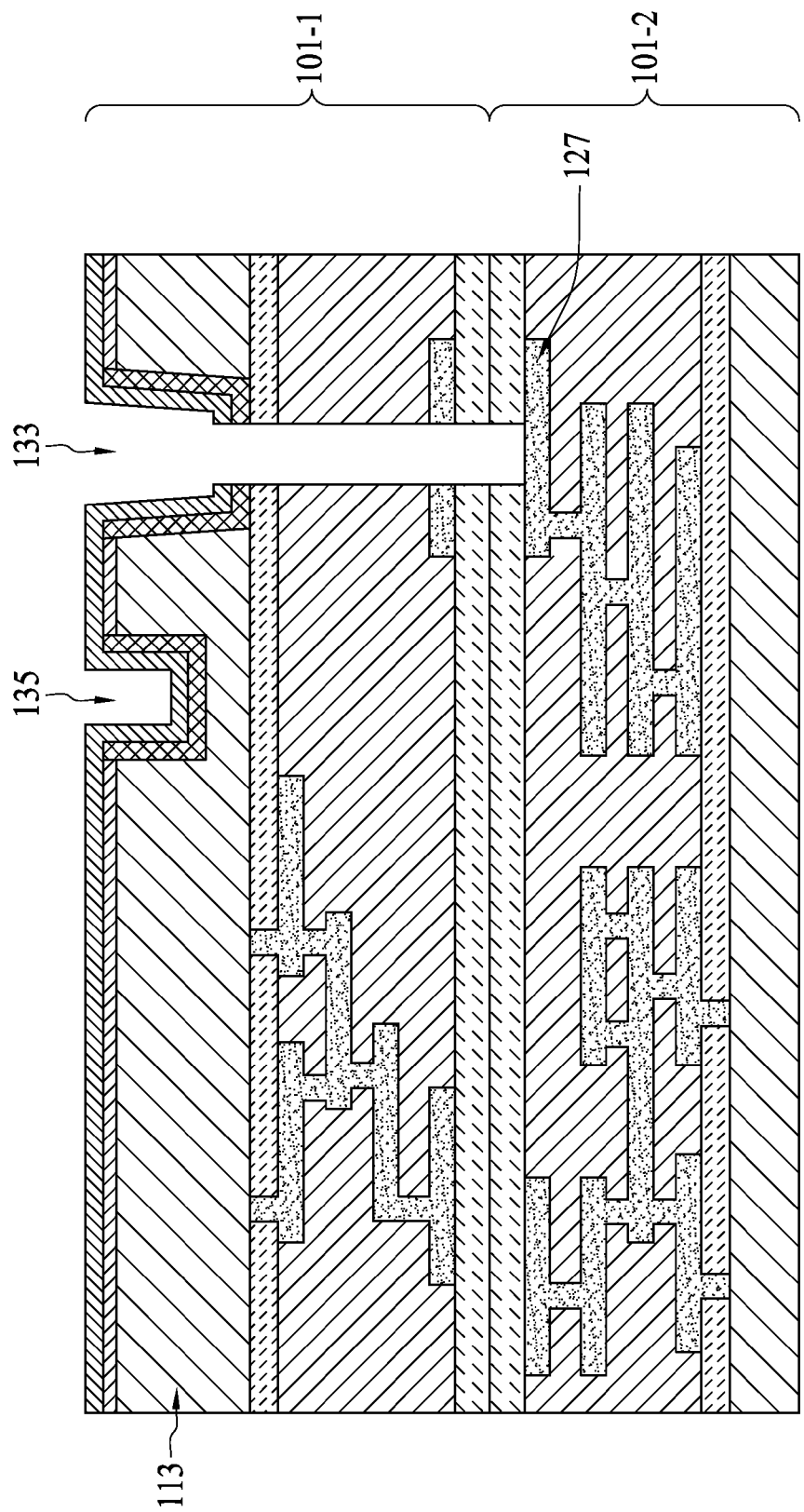

In operation 405, the first recess 133 further extends to be through the first semiconductor chip 101-1 and landing on a second metallic structure 127 of the second semiconductor chip 101-2 as shown in FIG. 4E. A via through the first semiconductor chip 101-1 and the second semiconductor chip 101-2 is formed at this operation. Operation 405 is also called a second drilling operation for the first recess 133, in which depth of the first recess 133 is further increased in order to extend into the second semiconductor chip 101-2. The drilling operation can be realized by various methods such as laser drill, chemical etch. In some embodiments, the hole formed during second drilling has a smaller diameter than that of the first recess 133 formed in operation 402.

Figure 4F:
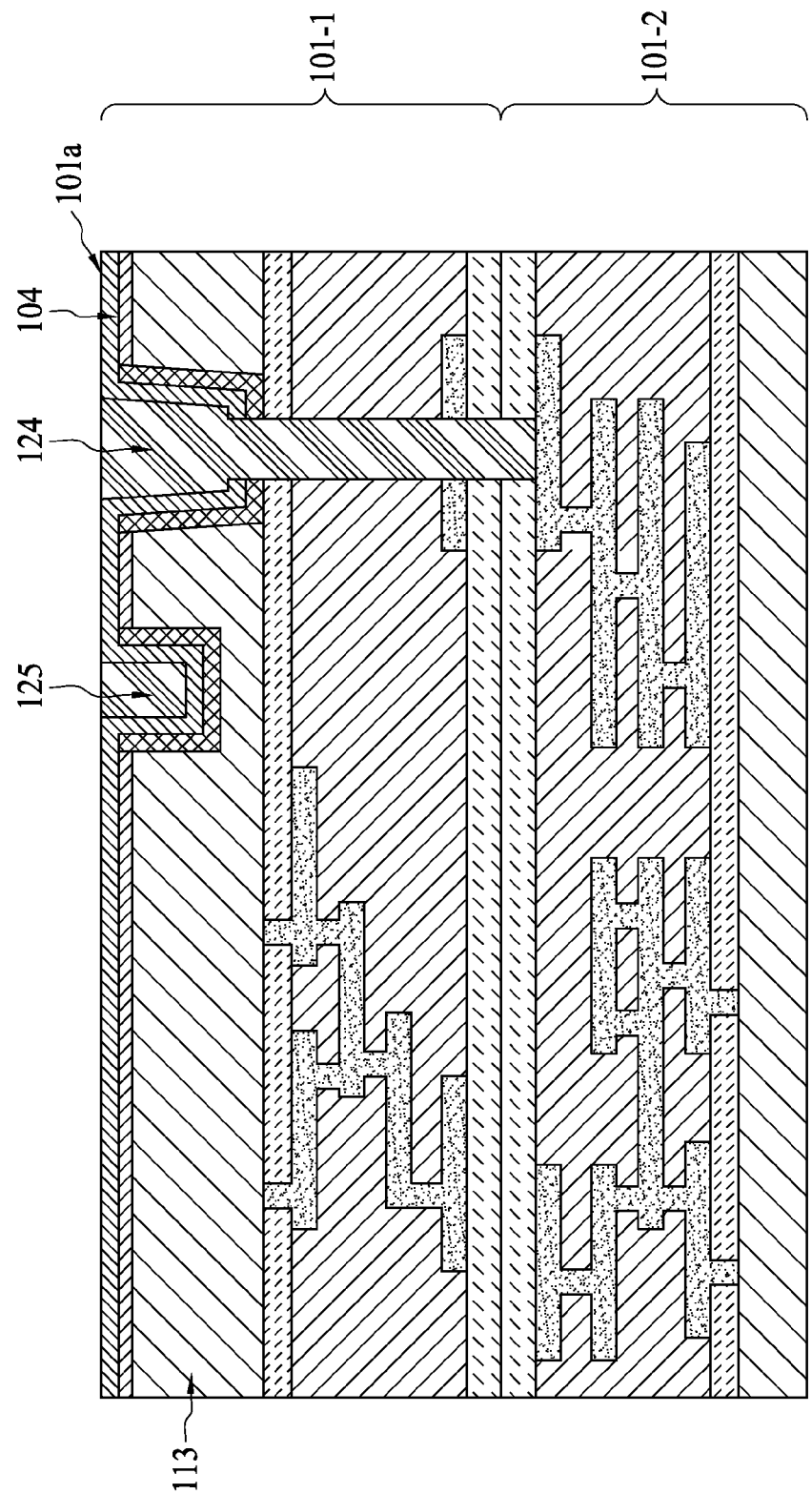

In operation 406, a conductive material fills in the first recess 133 and the second recess 135 so as to form a first conductive plug 124 and a second conductive plug 125 as in FIG. 4F. In some embodiments, there may be some excessive conductive materials disposed on the first surface 101a. An extra operation such as chemical mechanical planarization (CMP), etching or other methods is introduced to remove the excessive conductive materials from the first surface 101a.

In some embodiments, the forming of the conductive liner 104 along a sidewall of the second recess 135 is prior to extending the first recess 133 to be through the first semiconductor chip 101-1. Charges generated during the second drilling operation are conducted to the second recess 135 through the conductive liner 104. The charges may be accumulated on any surface exposed under sources such as plasma during the second drilling operation. However, since the exposed surface is covered by the conductive liner 104, the charges can be released into the first substrate 113 through the second recess 135. In some embodiments, the first recess 133 and the second recess 135 are formed by anisotropical etching operations. In some embodiments, the first recess 133 and the second recess 135 are formed by suitable deposition and photolithography techniques such as a reactive ion etch (RIE) or other dry etch, an anisotropic wet etch, or any other suitable anisotropic etching.

Figure 4G:
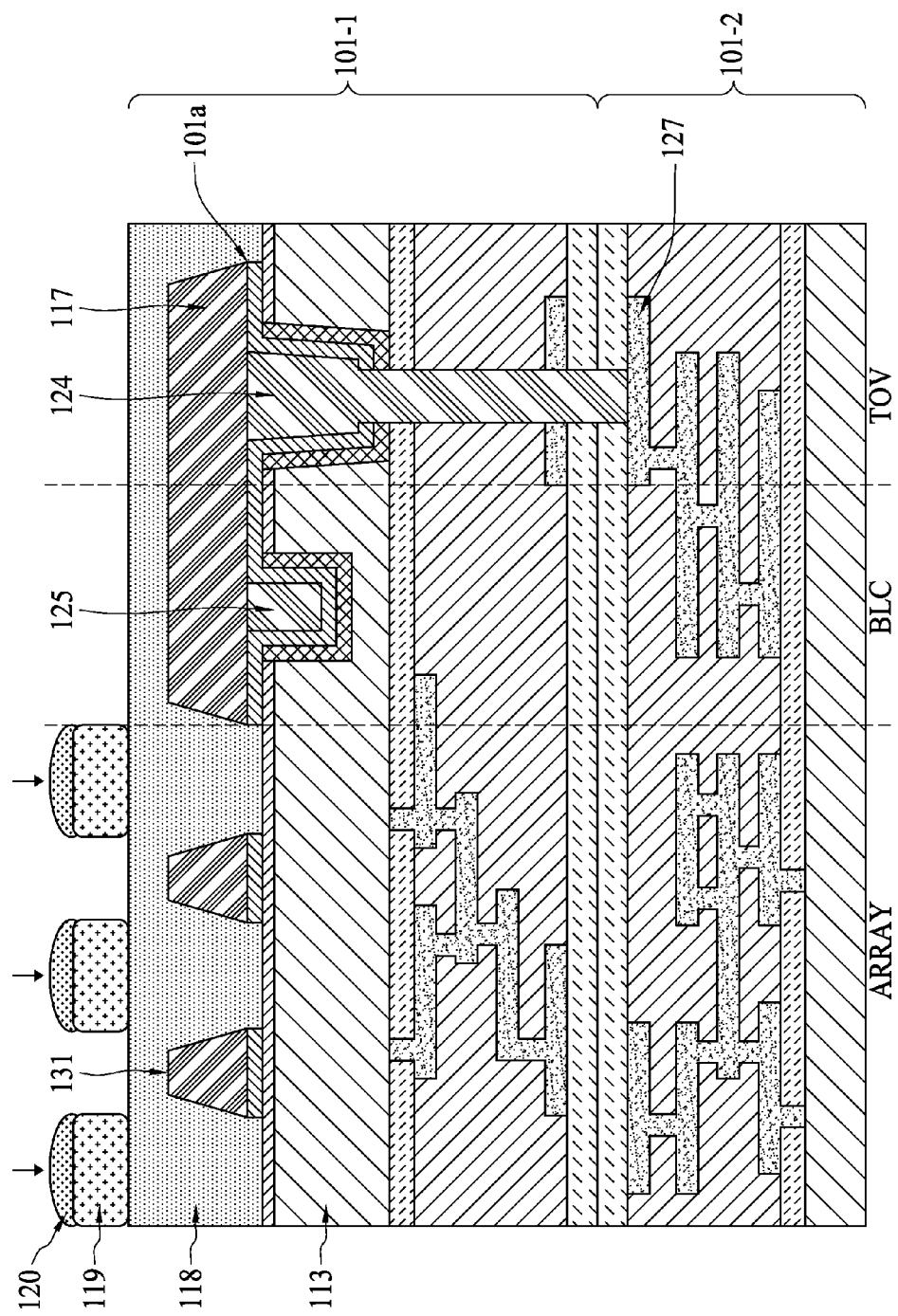

In operation 407, corresponding to FIG. 4G, the first metallic structure 117 is formed over the first surface 101a of the first semiconductor chip 101-1 and is then electrically connected with the second semiconductor chip 101-2 via the first conductive plug 124 extending from the first surface 101a of the first semiconductor 101-1 to the second metallic structure 127 of the second semiconductor chip 101-2. The second conductive plug 125 extends from the first surface 101a and protrudes into the first substrate 113 of the first semiconductor chip 101-1. A metal grid 131 is also formed simultaneously with the first metallic structure 117 and the metal grid 131 is in the array region of the first semiconductor chip 101-1. In some embodiments, the dielectric layer 118 is formed over the first semiconductor chip 101-1. Some of the dielectric layer 118 is removed by CMP or other methods. In some embodiments, color filters 119 are formed over the dielectric layer 118 and between the gaps of the metal grids. In some embodiments, micro lenses 120 are formed over the color filters.

In some embodiments, a semiconductor device includes a first semiconductor chip. The first semiconductor chip includes a first surface; a second surface opposite to the first surface; a substrate between the first surface and the second surface; and a first metallic structure above the first surface and electrically connected to the substrate. In some embodiments, the semiconductor device includes a second semiconductor chip comprising a second metallic structure and bonded with the first semiconductor chip on the second surface. In some embodiments, the semiconductor device includes a first conductive plug extending from the first semiconductor chip to the second semiconductor chip, and landing on the second metallic structure. In some embodiments, the semiconductor device includes a second conductive plug extending from the first metallic structure and into the substrate. In some embodiments, the semiconductor device includes a conductive liner along a sidewall of the first conductive plug or the second conductive plug.

In some embodiments, the first semiconductor chip comprises an array region, a black level collection (BCL) region and a through via (TOV) region, and the first metallic structure is above the BCL region. In some embodiments, electrical conductivity of the conductive liner is different from the first conductive plug or the second conductive plug. In some embodiments, electrical conductivity of the conductive liner is greater than the first conductive plug or the second conductive plug. In some embodiments, the conductive liner is between the first conductive plug and the substrate. In some embodiments, the conductive liner is between the second conductive plug and the substrate. In some embodiments, the thickness of the conductive liner is between about 100 Å and about 700 Å. In some embodiments, the conductive liner comprises tungsten, tantalum, or the alloy thereof. In some embodiments, the first semiconductor chip is a semiconductor image sensor chip, and the second semiconductor chip is a semiconductor application specific integrated circuit (ASIC) chip. In some embodiments, the first metallic structure is made of a conductive material and configured to block incident light entering into an optical sensing region of the first semiconductor chip through the first surface. In some embodiments, the conductive liner is formed over a seed layer.

In some embodiments, a semiconductor device includes a first semiconductor chip. The first semiconductor chip includes a first surface; a second surface opposite to the first surface; a substrate between the first surface and the second surface; and a first metallic structure above the first surface and electrically connected to the substrate. In some embodiments, the semiconductor device includes a second semiconductor chip comprising a second metallic structure and bonded with the first semiconductor chip on the second surface. In some embodiments, the semiconductor device includes a conductive plug extending from the first metallic structure contacting the substrate, wherein the conductive plug includes a plurality of coaxial conductive layers.

In some embodiments, the conductive plug extends into the second semiconductor chip. In some embodiments, the substrate comprises an image sensing device. In some embodiments, the semiconductor device includes a color filter above the first surface. In some embodiments, the semiconductor device includes a micro lens above the first surface.

In some embodiments, a method of manufacturing a semiconductor device includes bonding a first semiconductor chip with a second semiconductor chip on a bonding surface. In some embodiments, the method includes forming a first recess extending from a top surface of the first semiconductor chip to a predetermined distance inside the first semiconductor chip and a second recess extending from the top surface of the first semiconductor chip and protruding into the substrate of the first semiconductor chip. In some embodiments, the method includes forming a conductive liner along a sidewall of the first recess or the second recess. In some embodiments, the method includes extending the first recess to be through the first semiconductor chip and landing on a second metallic structure of the second semiconductor chip.

In some embodiments, forming the conductive liner along a sidewall of the second recess is prior to extending the first recess to be through the first semiconductor chip. In some embodiments, the method includes forming a seed layer along the sidewall of the first recess or the second recess. In some embodiments, the predetermined distance is deeper than the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first semiconductor chip comprising:
        a first surface;
        a second surface opposite to the first surface;
        a substrate between the first surface and the second surface; and
        a first metallic structure above the first surface and electrically connected to the substrate;
    a second semiconductor chip comprising a second metallic structure and bonded with the first semiconductor chip on the second surface;
    a first conductive plug extending from the first semiconductor chip to the second semiconductor chip, and landing on the second metallic structure;
    a second conductive plug extending from the first metallic structure and into the substrate; and
    a conductive liner only along a portion of a sidewall of the first conductive plug surrounded by the substrate.

2. The semiconductor device of claim 1, wherein the first semiconductor chip comprises an array region, a black level collection (BCL) region and a through via (TOV) region, and the first metallic structure is above the BCL region.

3. The semiconductor device of claim 1, wherein electrical conductivity of the conductive liner is different from electrical conductivity of the first conductive plug or electrical conductivity of the second conductive plug.

4. The semiconductor device of claim 1, wherein electrical conductivity of the conductive liner is greater than electrical conductivity of the first conductive plug or electrical conductivity of the second conductive plug.

5. The semiconductor device of claim 1, wherein the conductive liner is between the first conductive plug and the substrate.

6. The semiconductor device of claim 1, wherein the conductive liner is between the second conductive plug and the substrate.

7. The semiconductor device of claim 1, wherein the thickness of the conductive liner is between about 100 Å and about 700 Å.

8. The semiconductor device of claim 1, wherein the conductive liner comprises tungsten, tantalum, or the alloy thereof.

9. The semiconductor device of claim 1, wherein the first semiconductor chip is a semiconductor image sensor chip, and the second semiconductor chip is a semiconductor application specific integrated circuit (ASIC) chip.

10. The semiconductor device of claim 1, wherein the first metallic structure is made of a conductive material and configured to block incident light entering into an optical sensing region of the first semiconductor chip through the first surface.

11. The semiconductor device of claim 1, wherein the conductive liner is formed over a seed layer.

12. A semiconductor device, comprising:
    a first semiconductor chip comprising:
        a first surface;
        a second surface opposite to the first surface;
        a substrate between the first surface and the second surface;
        a dielectric layer between the substrate and the second surface; and
        a first metallic structure above the first surface and electrically connected to the substrate;
    a second semiconductor chip comprising a second metallic structure and bonded with the first semiconductor chip on the second surface; and
    a conductive plug extending from the first metallic structure contacting the substrate toward the second surface, wherein the conductive plug includes a plurality of coaxial conductive layers, the coaxial conductive layers being in the substrate and not in the dielectric layer.

13. The semiconductor device of claim 12, wherein the conductive plug extends into the second semiconductor chip.

14. The semiconductor device of claim 12, wherein the substrate comprises an image sensing device.

15. The semiconductor device of claim 12, further comprising a color filter above the first surface.

16. The semiconductor device of claim 12, further comprising a micro lens above the first surface.

17. A semiconductor device, comprising:
    a first semiconductor chip comprising:
        a first surface;
        a second surface opposite to the first surface;
        a substrate between the first surface and the second surface;
        a first semiconductive plug extending from a top surface of the first semiconductor chip to a first predetermined distance inside the first semiconductor chip; and
        a second semiconductive plug extending from the top surface of the first semiconductor chip to a second predetermined distance inside the first semiconductor chip,
        wherein a conductive liner is electrically connecting the first semiconductive plug and the second semiconductive plug, the conductive liner being in contact with a bottom of the second semiconductive plug and being free of contact with a bottom of the first semiconductive plug.

18. The semiconductor device of claim 17, wherein the first predetermined distance is greater than the second predetermined distance.

19. The semiconductor device of claim 17, wherein the conductive liner is along a sidewall of the first conductive plug or the second conductive plug.

20. The semiconductor device of claim 17, wherein the conductive liner and the first conductive plug or the conductive liner and the second conductive plug includes a coaxial conducive structure.

\* \* \* \* \*